(12) United States Patent
Tiwari

(10) Patent No.: US 7,549,136 B2
(45) Date of Patent: Jun. 16, 2009

(54) SYSTEM AND METHOD FOR APPROXIMATING INTRINSIC CAPACITANCE OF AN IC BLOCK

(75) Inventor: Vipin Kumar Tiwari, Fremont, CA (US)

(73) Assignee: Virage Logic Corp., Fremont, CA (US)

( * ) Notice: Subject to any disclaimer, the term of this patent is extended or adjusted under 35 U.S.C. 154(b) by 196 days.

(21) Appl. No.: 11/614,133

(22) Filed: Dec. 22, 2006

(65) Prior Publication Data

US 2007/0162879 A1 Jul. 12, 2007

Related U.S. Application Data

(60) Provisional application No. 60/758,017, filed on Jan. 11, 2006.

(51) Int. Cl.
*G06F 17/50* (2006.01)
*G06F 17/10* (2006.01)

(52) U.S. Cl. .................................. 716/5; 703/2; 703/16

(58) Field of Classification Search .................. 716/5; 703/2, 16
See application file for complete search history.

(56) References Cited

U.S. PATENT DOCUMENTS

| | | | | |
|---|---|---|---|---|
| 3,612,997 A | * | 10/1971 | Paulkovich | 324/678 |
| 5,164,811 A | * | 11/1992 | Tamura | 257/206 |
| 6,370,674 B1 | * | 4/2002 | Thill | 716/4 |
| 6,480,987 B1 | * | 11/2002 | McBride | 716/5 |
| 6,665,843 B2 | * | 12/2003 | Frech et al. | 716/4 |
| 6,807,656 B1 | * | 10/2004 | Gradin et al. | 716/4 |
| 2004/0199882 A1 | * | 10/2004 | Cao et al. | 716/4 |
| 2005/0253616 A1 | * | 11/2005 | Parker et al. | 324/765 |

OTHER PUBLICATIONS

Zhou et al., "Modeling the Intrinsic Inductance of Embedded Capacitors", Electrical Performance of Electronic Packaging, 2002, pp. 167-170.*

* cited by examiner

*Primary Examiner*—Phallaka Kik
(74) *Attorney, Agent, or Firm*—The Danamraj Law Group, P.C.

(57) ABSTRACT

A system, method, and computer program product for approximating intrinsic capacitance of an integrated circuit (IC) block such as, for example, a compliable memory instance. Estimates of N-well capacitance, metal grid capacitance, and non-switching circuitry capacitance associated with the IC block are obtained. A total intrinsic capacitance of the IC block is then estimated based on the aforesaid constituent estimates.

22 Claims, 8 Drawing Sheets

SYSTEM AND METHOD FOR APPROXIMATING INTRINSIC CAPACITANCE OF AN IC BLOCK

PRIORITY UNDER 35 U.S.C. §119(e) & 37 C.F.R. §1.78

This nonprovisional application claims priority based upon the following prior U.S. provisional patent application entitled: "PEAK CURRENT MODELING OF MEMORY COMPILERS," Application No. 60/758,017, filed on Jan. 11, 2006, in the name(s) of Vipin Kumar Tiwari, which is hereby incorporated by reference.

CROSS-REFERENCE TO RELATED APPLICATION(S)

This application discloses subject matter related to the subject matter disclosed in the following commonly owned co-pending U.S. patent application(s): (i) "SYSTEM AND METHOD FOR PEAK CURRENT MODELING FOR AN IC DESIGN", filed on Nov. 7, 2006, Application Ser. No. 11/593,729, in the name(s) of: Vipin Kumar Tiwari, Manish Bhatia, and Abhijit Ray; each of which is hereby incorporated by reference in its entirety.

BACKGROUND

1. Technical Field

The present disclosure relates generally to semiconductor memories. More particularly, and not by way of any limitation, the present disclosure is directed to a system and method for approximating intrinsic capacitance of an integrated circuit (IC) design.

2. Description of Related Art

Silicon manufacturing advances today allow true single-chip systems to be fabricated on a single die (i.e., System-On-Chip or SOC integration). However, there exists a "design gap" between today's electronic design automation (EDA) tools and the advances in silicon processes which recognizes that the available silicon real-estate has grown much faster than has designers' productivity, leading to underutilized silicon. Unfortunately, the trends are not encouraging: the "deep submicron" problems of non-convergent timing, complicated timing and extraction requirements, and other complex electrical effects are making silicon implementation harder. This is especially acute when one considers that various types of circuitry such as analog blocks, non-volatile memory (e.g., read-only memory or ROM), random access memories (RAMs), and other "non-logic" cells are being required. The gap in available silicon capacity versus design productivity means that without some fundamental change in methodology, it will take several staff years to develop leading-edge integrated circuits (ICs).

Design re-use has emerged as the key methodology solution for successfully addressing this time-to-market problem in semiconductor IC design. In this paradigm, instead of re-designing every part of every IC chip, engineers can re-use existing designs as much as possible and thus minimize the amount of new circuitry that must be created from scratch. It is commonly accepted in the semiconductor industry that one of the most prevalent and promising methods of design re-use is through what are known as Intellectual Property ("IP") components—pre-implemented, re-usable modules of circuitry that can be quickly inserted and verified to create a single-chip system. Such re-usable IP components are typically provided as megacells, cores, macros, embedded memories through generators or memory compilers, et cetera.

It is well known that memory is a key technology driver for SOC design. It is also well known that obtaining accurate peak current estimates with respect to a memory instance is a major factor in designing high performance memories because of the requirement of adequate budgeting of an external decoupling or bypass capacitor that mitigates the parasitic inductive effects caused by the high frequency currents. Given that memories typically experience high current demands for only a short period of time due to simultaneous switching operations in the circuitry (thereby causing the parasitic voltages on the power supply lines), peak current demand requirements need to be estimated accurately as well as efficiently for a particular IC design. This is especially relevant where memory compilers have a wide range of memory configurations and peak current demands need to be estimated for each memory configuration. In addition, an accurate estimate of the IC design's internal capacitance needs to be provided in order that a suitable external decoupling capacitance may be designed with respect to the IC design, since the decoupling capacitance is generally a function of the design's peak current demand as well as its intrinsic capacitance.

SUMMARY

In one aspect, the present disclosure is directed to an embodiment of a method of approximating intrinsic capacitance of an IC block. The claimed embodiment comprises: estimating an N-well capacitance associated with the IC block to obtain an N-well capacitance estimate; estimating a metal grid capacitance associated with the IC block to obtain a metal grid capacitance estimate; estimating a non-switching circuitry capacitance associated with the IC block to obtain a non-switching circuitry capacitance estimate; and estimating a total intrinsic capacitance associated with the IC block based on the estimates of N-well capacitance, metal grid capacitance and non-switching circuitry capacitance.

In another aspect, the present disclosure is directed to an embodiment of a computer-implemented system for approximating intrinsic capacitance of an IC block. The claimed system comprises: means for estimating an N-well capacitance associated with the IC block to obtain an N-well capacitance estimate; means for estimating a metal grid capacitance associated with the IC block to obtain a metal grid capacitance estimate; means for estimating a non-switching circuitry capacitance associated with the IC block to obtain a non-switching circuitry capacitance estimate; and means for estimating a total intrinsic capacitance associated with the IC block based on the estimates of N-well capacitance, metal grid capacitance and non-switching circuitry capacitance.

In a still further aspect, the present disclosure is directed to a computer program product operable to be executed in association with a computer system, the computer program product having instructions for approximating intrinsic capacitance of an IC block. The claimed computer program product comprises: a code portion for estimating an N-well capacitance associated with the IC block to obtain an N-well capacitance estimate; a code portion for estimating a metal grid capacitance associated with the IC block to obtain a metal grid capacitance estimate; a code portion for estimating a non-switching circuitry capacitance associated with the IC block to obtain a non-switching circuitry capacitance estimate; and a code portion for estimating a total intrinsic capacitance associated with the IC block based on the estimates of N-well capacitance, metal grid capacitance and non-switching circuitry capacitance.

BRIEF DESCRIPTION OF THE DRAWINGS

A more complete understanding of the present disclosure may be had by reference to the following Detailed Description when taken in conjunction with the accompanying drawings wherein.

DETAILED DESCRIPTION OF THE DRAWINGS

Figure 1:
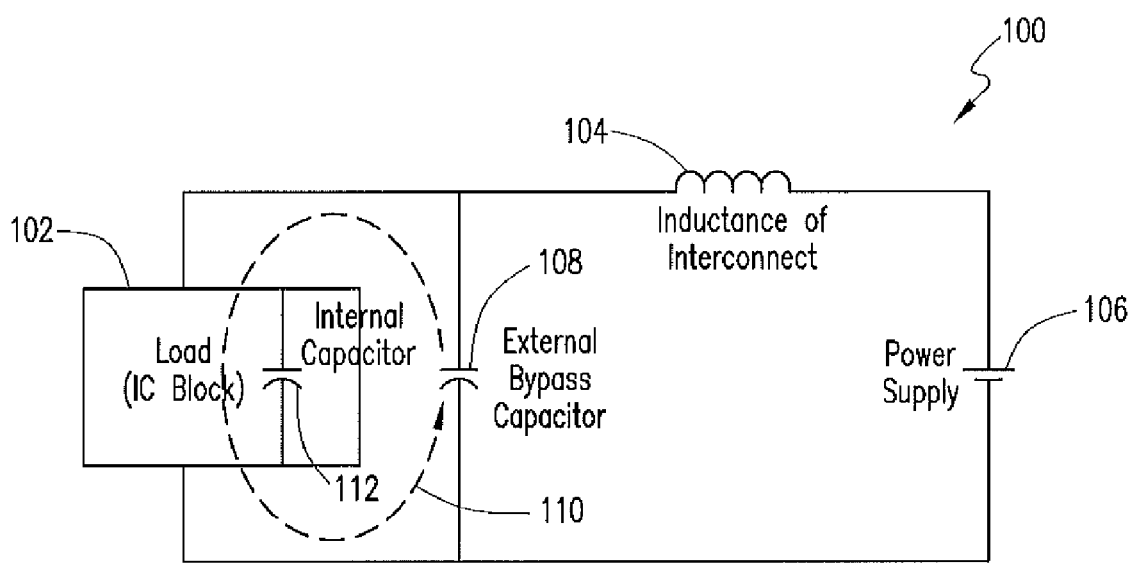
FIG. 1 depicts a high-level circuit abstraction scheme involving an IC block where intrinsic capacitance may be approximated according to one or more embodiments of the present disclosure.

In the drawings, like or similar elements are designated with identical reference numerals throughout the several views thereof, and the various elements depicted are not necessarily drawn to scale. Referring now to FIG. 1, depicted therein is a high-level circuit abstraction scheme 100 involving an IC block 102 where intrinsic capacitance may be approximated according to one or more embodiments of the present disclosure. At the outset, those skilled in the art should recognize that IC block 102 may be comprised of any electronic integrated circuitry, e.g., a compliable memory instance of any known or heretofore unknown functionality, technology, and/or process, wherein peak current demand as well as intrinsic capacitance are to be modeled efficiently as well as with acceptable levels of accuracy so that a suitable external bypass capacitance 108 may be budgeted accordingly. A power supply 106 is operable to provide current in order for driving the circuitry of IC block 102. As alluded to in the Background section of the present disclosure, circuitry such as IC block 102 typically demands high currents in a bursty fashion for short periods of time because of simultaneous switching of a large number of internal capacitors. At high frequencies, power supply buses (i.e., interconnect) of the circuitry operate as parasitic inductors that tend to induce a voltage of opposite polarity on the power supply buses, which may be modeled as a lumped parasitic inductor 104 in the circuit abstraction scheme 100 shown in FIG. 1. Reference numeral 110 illustratively refers to a return path of current at high frequencies that counteracts normal current flows in the circuitry of IC block 102. In addition, the total intrinsic or internal capacitance of IC block 102 may be exemplified as a lumped capacitor 112 with respect to the circuitry of the IC block, which needs to be approximated as will be described in detail hereinbelow.

In general, one or more embodiments of the present disclosure may utilize the observation that peak current demand is typically triggered by certain operations or events (referred to herein as IC block events) associated with IC block 102. In the context of a memory instance, such events may comprise, e.g., wordline switching, bitline switching, and the like, associated with a memory read or write operation. Accordingly, the time duration associated with an IC block event may be segmented appropriately with sufficient granularity such that a current demand curve may be modeled accurately and efficiently in order to estimate IC block's peak current requirements for purposes of designing the bypass capacitance. Additional details regarding the modeling of peak current demand of an IC block may be found in the following co-pending commonly assigned U.S. patent application entitled "SYSTEM AND METHOD FOR PEAK CURRENT MODELING FOR AN IC DESIGN", filed on Nov. 7, 2006, application Ser. No.: 11/593,729, in the name(s) of: Vipin Kumar Tiwari, Manish Bhatia, and Abhijit Ray", which has been cross-referenced hereinabove.

With respect to the modeling of the intrinsic capacitance 112, the present disclosure proposes that the IC block's intrinsic capacitance may be divided into a number of constituent components, each of which may be estimated separately in an efficient and accurate manner, which then may be accumulated to obtain an aggregate capacitance estimate. Accordingly, the total intrinsic capacitance 112 of IC block 102 may be modeled, e.g., as a linear function set forth below:

$$C_{TOTAL} = C_{NW} + C_{NS} + C_M + C_{DCAP}$$

where $C_{TOTAL}$=total intrinsic capacitance; $C_{NW}$=total N-well capacitance; $C_{NS}$=non-switching circuitry capacitance; $C_M$=metal grid capacitance; and $C_{DCAP}$=optional internal decoupling capacitor, if provided. As will be set forth in detail below, one or more of these capacitance components may be estimated on a leaf cell basis and extrapolated to the entire IC block. Accordingly, once the leaf cells' capacitance components are determined by way of initial estimation process during the generation of leaf cells, simulation of the IC block circuitry to obtain the block's total capacitance may be advantageously avoided, particularly even where different memory configurations are to be compiled. In other words, total intrinsic capacitance may be estimated relatively "on-the-fly," with fairly accurate results while substantially reducing computational and/or simulation efforts.

Figure 2:
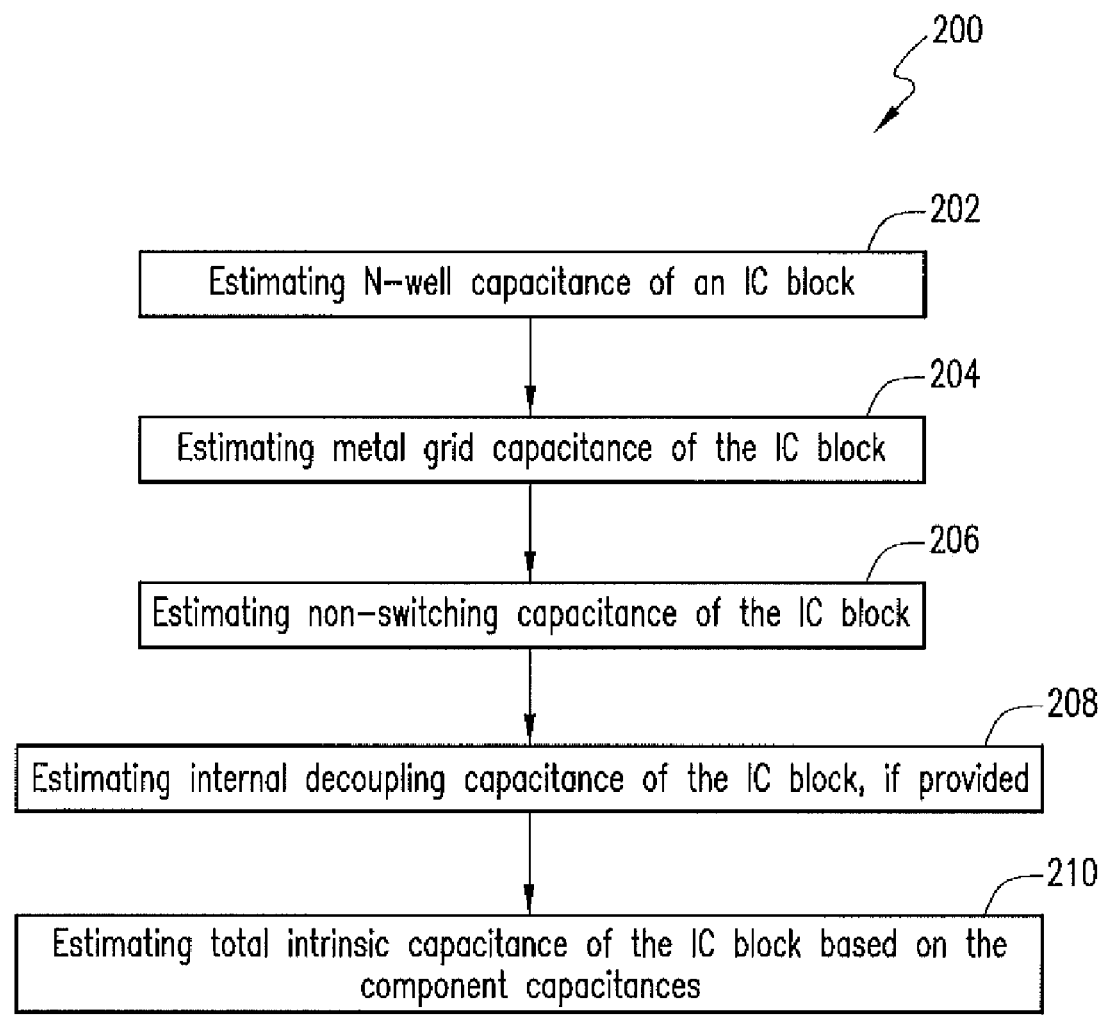
FIG. 2 is a flowchart of a method of approximating intrinsic capacitance of an IC block in one embodiment.

FIG. 2 exemplifies a flowchart of a scheme 200 for approximating intrinsic capacitance of an IC block in one embodiment. As illustrated in block 202, an N-well capacitance of the IC block is estimated wherein the IC block may be modeled as a complementary metal oxide semiconductor (CMOS)-based circuit, whereby a total N-well capacitance estimate is obtained. A metal grid capacitance associated with the IC block is then estimated (block 204). Likewise, non-switching circuitry capacitance of the IC block is estimated (block 206). Additionally, if an internal decoupling capacitance is determined to be associated with the circuitry of the IC block, that capacitance is also estimated (block 208). Thereafter, the total intrinsic capacitance associated with the IC block is approximated based on the foregoing estimates of component capacitances (block 210), which may be a linear model as set forth above or in some other functional relationship.

Figure 3:
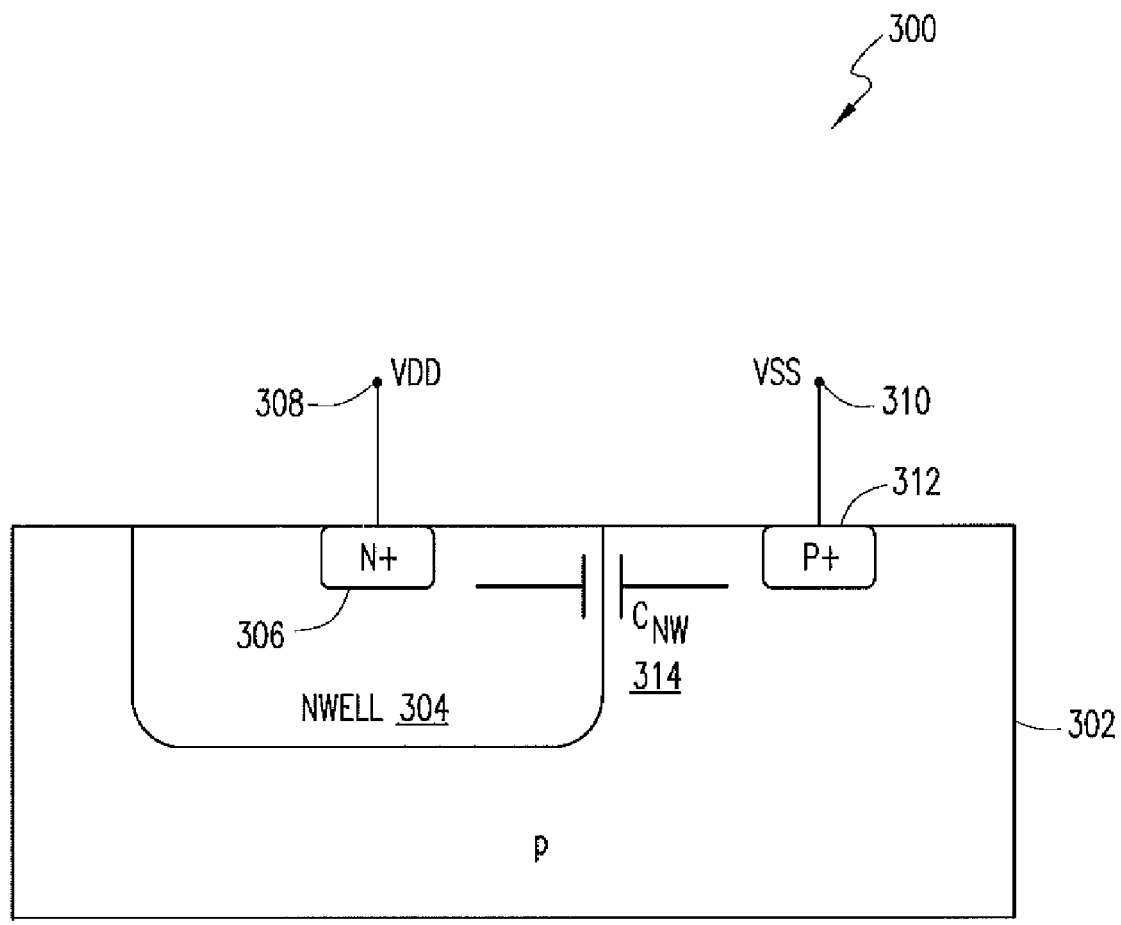
FIG. 3 depicts an exemplary CMOS model for illustrating N-well capacitance of an IC block.

Referring now to FIG. 3, an exemplary CMOS model 300 is provided for illustrating N-well capacitance with respect to an IC block. Within a p-substrate 302, an N-well 304 is provided with an N+ region 306 that is electrically coupled to a VDD terminal 308. A P+ region 312 is provided in the p-substrate, which is electrically coupled to a VSS terminal 310. At the device level, $C_{NW}$ (i.e., N-well capacitance) is associated with the N-well diode that may be disposed between VDD and VSS at a large number of locations in the PMOS circuitry of the IC block (except the floating N-wells). Accordingly, in one exemplary implementation, the PMOS devices of the IC block may be deemed to have the bulk substrate connected to VDD. Further, N-well to the p-substrate depletion capacitance in the reverse bias (bias voltage being VDD) may be modeled for a leaf cell by the following equation:

$$C_{NWLC} = C_{dep} = C_{jeff}(1+VDD/PB)^{-MJ} + C_{jsweff}(1+VDD/PHP)^{-MJSW}$$

where $C_{dep}$=Leaf cell LC's N-well to p-substrate depletion capacitance;

$C_{jeff}=C_j*$Area;

$C_j$=Zero bias junction capacitance per unit area junction bottom wall area;

PB=Area junction contact potential;

MJ=Area junction grading coefficient;

$C_{jsweff}=C_{jsw}*$perimeter;

$C_{jsw}$=Zero bias junction capacitance per unit junction periphery;

PHP=Periphery junction contact potential; and

MJSW=Periphery junction grading coefficient.

As one of ordinary skill should appreciate, these values are typically fixed for a particular VDD, process and temperature, and the like, and may be determined based on appropriate device/circuit modeling (e.g., SPICE models relating to N-well to p-substrate). By inserting the parametric values for a particular VDD, $C_{NWLC}$ may be reduced to a linear function of area and perimeter as set forth below:

$$C_{NWLC} = A_1*area_{LC} + A_2*perimeter_{LC}$$

where $A_1$ and $A_2$ are process/technology-dependent parametric coefficients and area and perimeter are based on the dimensions of an N-well diode in a leaf cell LC of the IC block. To generalize the total N-well capacitance component, the following linear model may be employed:

$$C_{NWTOTAL} = C_{NWLCI}*N_I + C_{NWLCJ}*N_J + C_{NWLCK}*N_K + \ldots$$

where $N_I$, $N_J$, $N_K$, and so on are the number of occurrences of different types of leaf cells, e.g., LC(I), LC(J), LC(K), etc., and $C_{NWLCI}$, $C_{NWLCJ}$, and $C_{NWLCK}$ are the corresponding leaf cell N-well capacitances.

In one implementation, a modified LVS deck may be used to find the N-well diodes in any leaf cell of the IC block, wherein the IC block floor plan may be segmented into a number of functional areas. By way of example, the following code may be provided in an LVS deck to extract the diodes:

```
/*
DEVICE D(DNWPEAK) nwell pwell nwell
[
property A, P
A = area(nwell)
P = perim(nwell)
]
TRACE PROPERTY D(DNWPEAK) A A 1
TRACE PROPERTY D(DNWPEAK) P P 1
*/
```

Well-known IC design software such as Caliber may be run as follows in order to generate appropriate SPICE netlist in a flat mode:

Caliber-lvs-bpf-ixf-nxf ruledeck

The resulting netlist includes the N-well/p-substrate diodes, which may be filtered for the diodes disposed between VDD and VSS, wherein requisite area and perimeter data may be added appropriately. As will be described below, the N-well capacitance may be estimated on a leaf cell basis that can be extrapolated and aggregated for the entire IC block.

Figure 4:
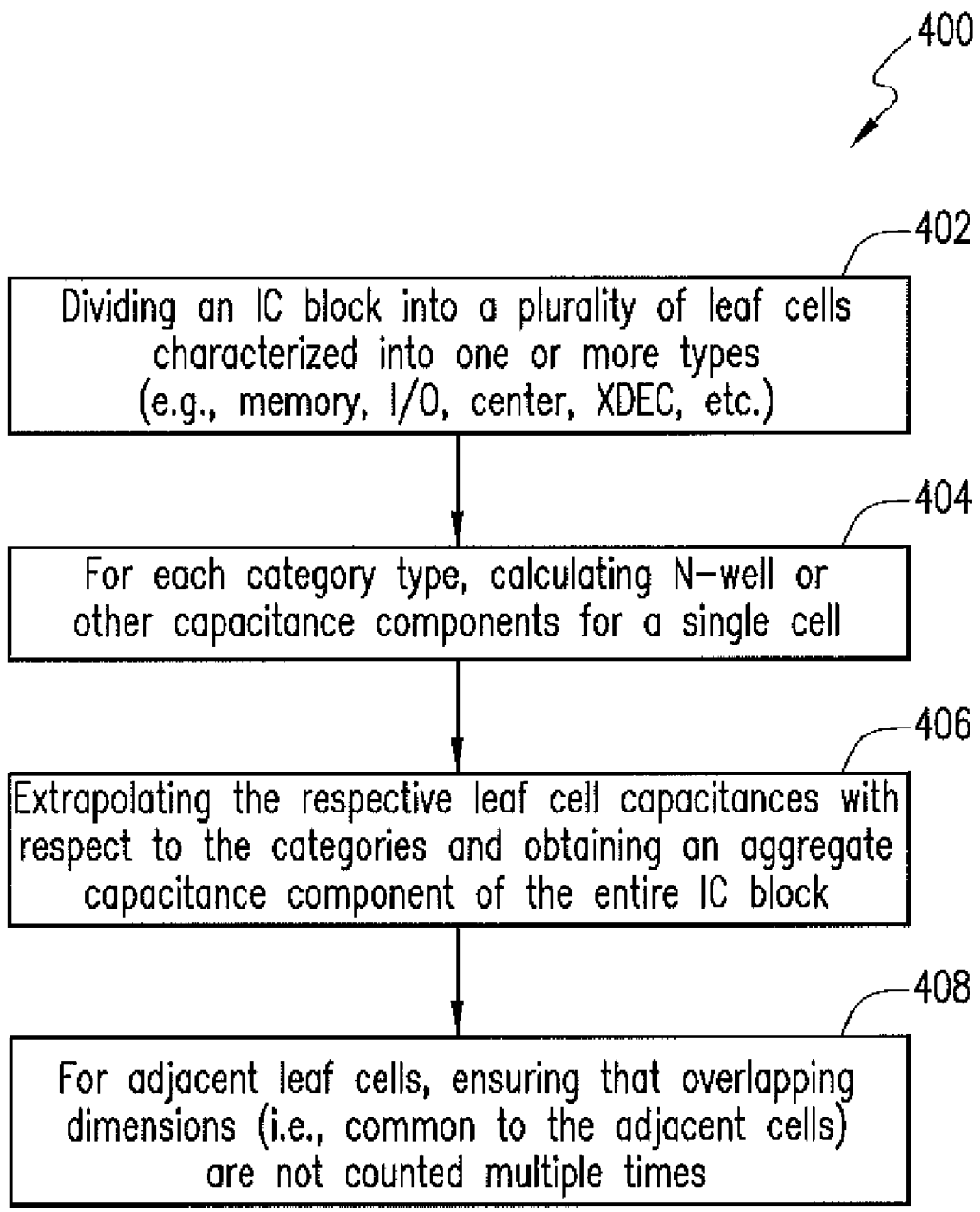
FIG. 4 depicts a flowchart of a method of estimating N-well capacitance of an IC block in one embodiment.

FIG. 4 depicts a flowchart of a scheme 400 for estimating N-well capacitance of an IC block in one embodiment. An IC block may be divided into a plurality of leaf cells characterized into one or more group types such as, for example, memory, Input/Output (I/O), row decoder or XDEC, column multiplexer or COLMUX, control block or center, and the like (block 402). For each category or group, N-well capacitance may be estimated for a single leaf cell thereof (block 404) as described hereinabove. Similarly, other components of the total intrinsic capacitance, e.g., metal grid capacitance, non-switching circuitry capacitance, or internal decoupling capacitance, may be estimated for the leaf cell. The respective leaf cell capacitance of a particular functional category/group may be extrapolated to the entire group. Subsequently, the group estimates of the N-well capacitance may be aggregated to obtain the N-well estimate for the entire IC block (block 406). By way of ensuring accuracy and reliability of the extrapolation and aggregation, care needs to be taken that for adjacent leaf cells, overlapping dimensions (e.g, sides that are common to or shared between the adjacent cells) are not counted multiple times, which otherwise may result in erroneous area and/or perimeter computations (block 408). Accordingly, in one implementation, a leaf cell may be designated or selected such that it does not share an N-well boundary with another leaf cell, for example.

Figure 5A:
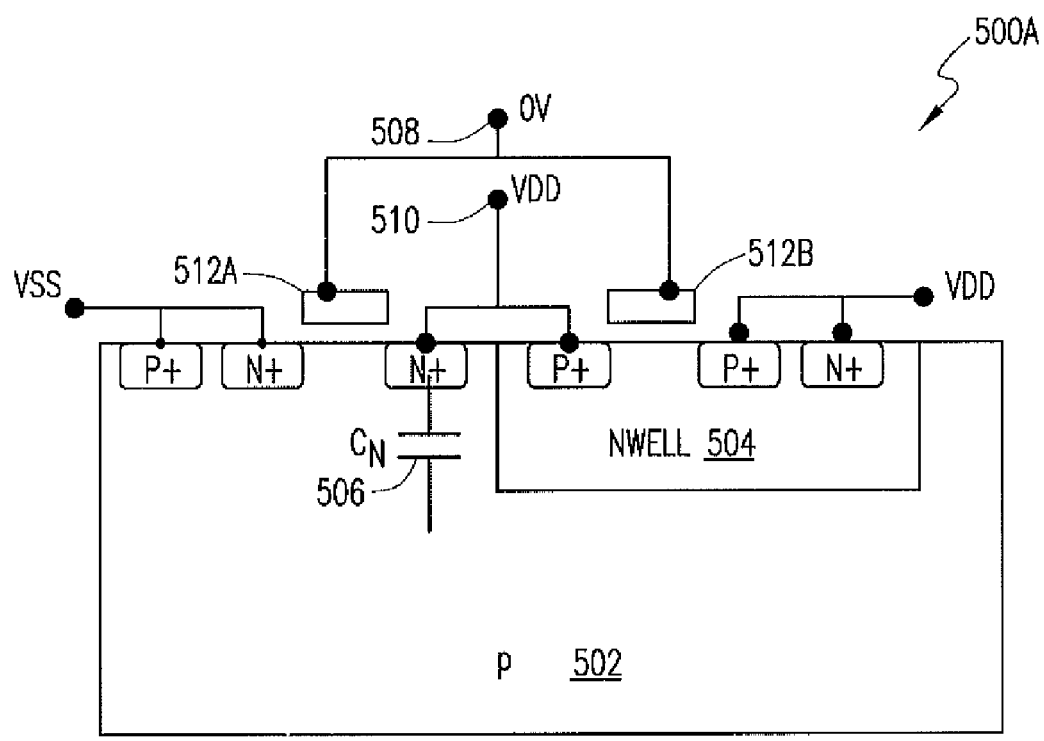
FIGS. 5A and 5B depict exemplary CMOS models for illustrating non-switching circuitry capacitance of an IC block.
Figure 5B:
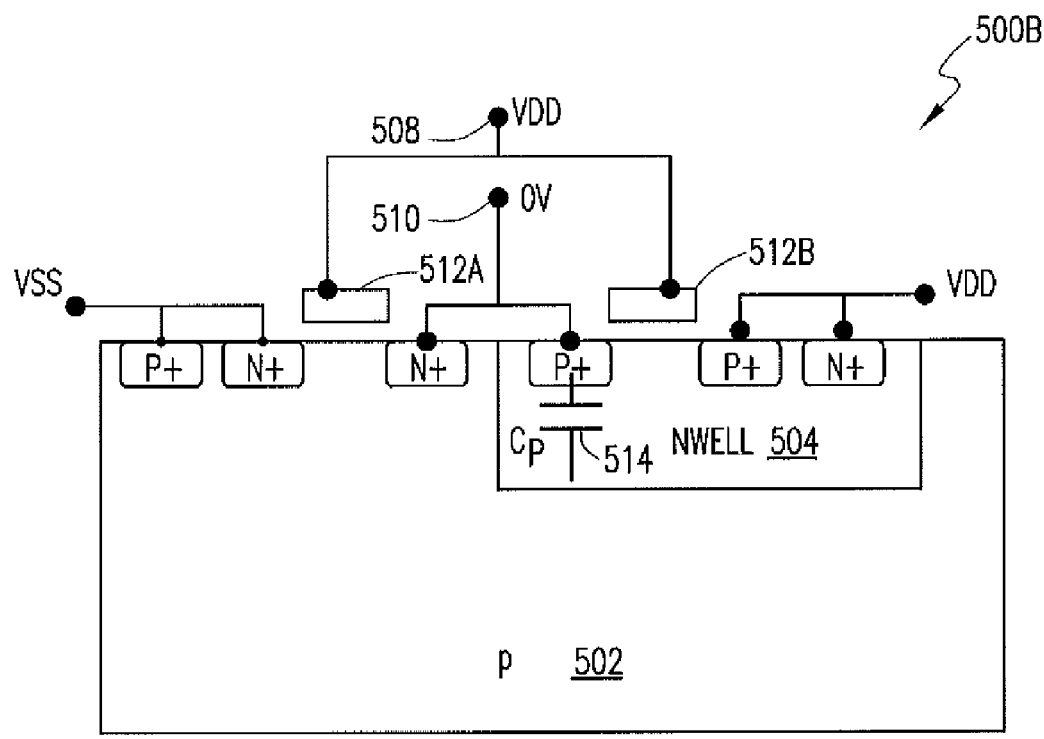

FIGS. 5A and 5B depict exemplary CMOS inverter models 500A and 500B for illustrating non-switching circuitry capacitance ($C_{NS}$) of an IC block. For purposes of the present patent disclosure, $C_{NS}$ is deemed to be the built-in capacitance between VDD and VSS in non-switching circuits of the IC block that may be undergoing activity. Typically, the $C_{NS}$ component is made of two constituents, $C_N$ and $C_P$ which are illustrated in FIGS. 5A and 5B, respectively, where two different static conditions of an inverter are exemplified. Reference numeral 500A is representative of the condition where the inverter's input is at 0 volts. A p-substrate 502 includes an N-well 504 (also represented as NWELL in FIG. 5A), in which one of the transistors of the inverter is disposed. Gates 512A and 512B of the two transistor devices are tied together to form the input 50B that is maintained at 0 volts. The $C_N$ component is disposed between the N+ terminal (that is coupled to the common output terminal 510 maintained at VDD) and the p-substrate 502 and is represented as a capacitor 506. Similarly, with respect to FIG. 5B, the $C_P$ component is disposed between the P+ terminal (that is coupled to the common output terminal 510 maintained at 0 volts) and the N-well 504 and is represented as a capacitor 514, except that the input 508 of the inverter 500B is maintained at VDD.

Total non-switching circuitry capacitance of an IC block is generally treated as equal to the sum of all $C_P$ and $C_N$ capacitances in the IC block. If all non-switching transistors and their states in a leaf cell are known, the total non-switching circuitry capacitance may be computed accurately. However, where a memory instance is being modeled, at least a portion of the memory cells are active during read/write operations, and all such active transistors may be excluded from the non-switching circuitry capacitance estimate. During a read or write operation, typically only center, one XDEC row, all I/Os, one memory row (selected based on the decoded row address), the reference circuitry, etc. may be treated as being in switching condition. The remainder of the IC block, i.e., the rest of the memory array, inactive XDEC portion, and the like, for example, may then be treated as non-switching circuitry with respect to which a capacitance estimate needs to be obtained.

Figure 6:
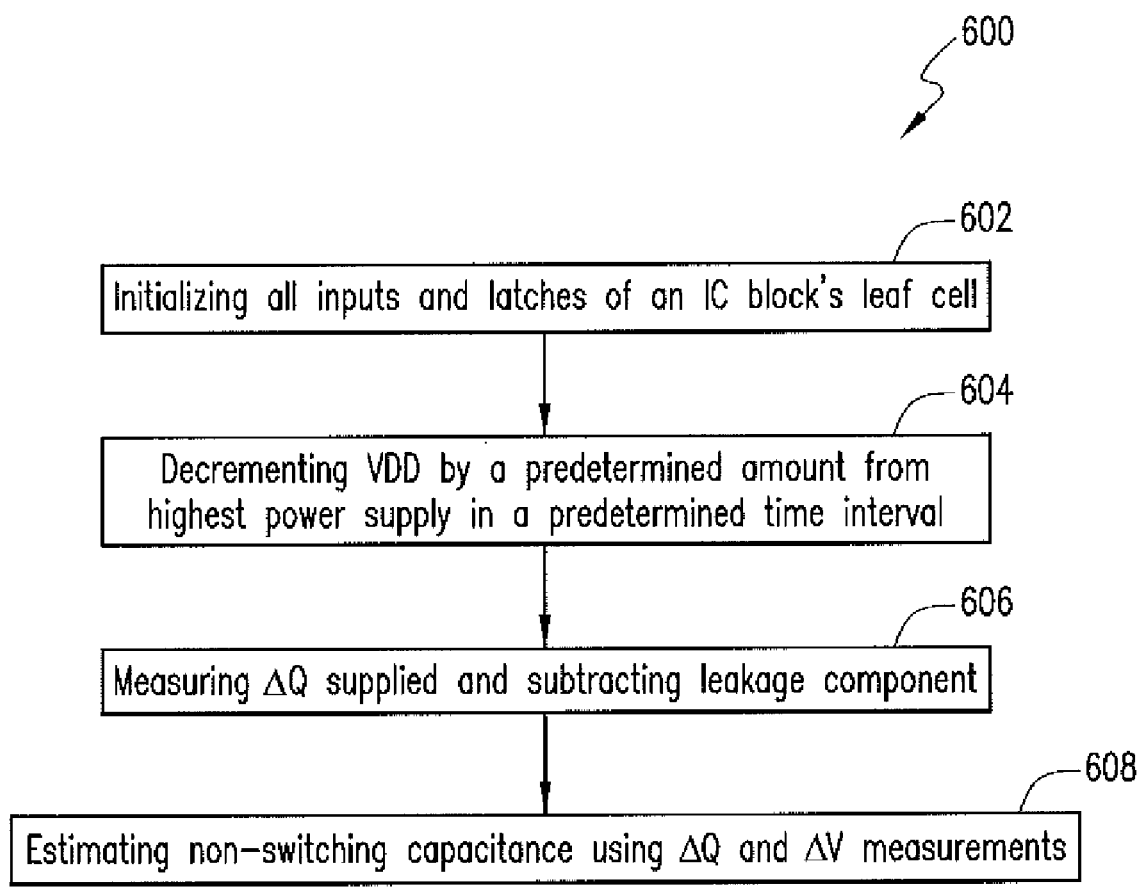
FIG. 6 depicts a flowchart of a method of estimating non-switching circuitry capacitance of an IC block in one embodiment.

FIG. 6 depicts a flowchart of a scheme 600 for estimating non-switching circuitry capacitance of an IC block in one embodiment 600. Non-switching capacitance of a leaf cell (e.g., a memory leaf cell or an XDEC leaf cell) may be measured upon initializing all inputs and latches (block 602). VDD is decremented (block 604) by a predetermined amount (e.g., 100 mV) from a highest power supply in a predetermined time interval (e.g., 1 ns). A change in electric charge ($\Delta Q$) being supplied is measured, in addition to optionally subtracting any leakage component in an exemplary implementation (block 606). The $C_{NS}$ component estimate for the leaf cell (LC) is then obtained based on the $\Delta Q$ and $\Delta V$ measurements ($C_{NSLC} = \Delta Q / \Delta V$) (block 608). Similar to the analysis previously, the following linear model may be employed to obtain the total $C_{NS}$ component of an IC block:

$$C_{NSTOTAL} = C_{NSLCI} * N_I + C_{NSLCJ} * N_J + C_{NSLCK} * N_K + \ldots$$

Generally, the foregoing $C_{NS}$ component estimate may also include metal capacitance of VDD/VSS in the leaf cells. Since all global lines in a memory instance may be precharged to VDD during the entire clock cycle, they play an important role in the measurement of $C_{NS}$. Accordingly, appropriate corrective measures may have to be taken when estimating the $C_{NS}$ values of array leaf cells (since the bitlines are normally precharged) as well as XDEC leaf cells (since pre-decoded lines may be precharged in a NOR-based decoder).

With respect to the VDD/VSS metal grid capacitance of the switching components of an IC block, the $C_M$ estimate may be obtained during the extraction of leaf cells of the IC block by way of a lumped capacitance parameter. The following equation may be used for the computation:

$$C_{MTOTAL} = C_{VDD\_LCI} * N_I + C_{VDD\_LCJ} * N_J + C_{VDD\_LCK} * N_K + \ldots$$

where $N_I$, $N_J$, $N_K$ and so on are the occurrences of leaf cell (LC) I, leaf cell J, leaf cell K, etc., respectively; and $C_{VDD\_LCI}$, $C_{VDD\_LCJ}$, $C_{VDD\_LCJ}$ and so on represent corresponding metal capacitances.

Figure 7:
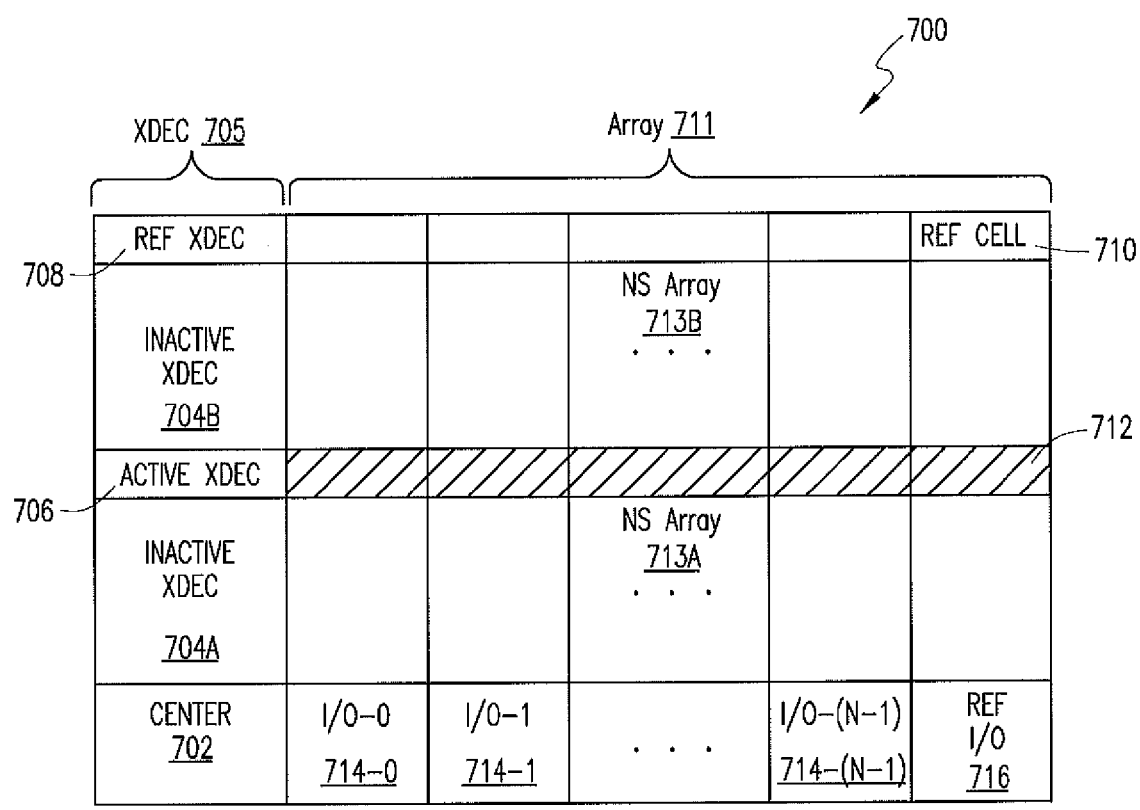
FIG. 7 depicts an exemplary IC block with different functional blocks.

FIG. 7 depicts an exemplary IC block's floor plan 700 with different functional blocks where a memory instance is illustrated for purposes of intrinsic capacitance estimation. Floor plan 700 includes a center 702 operable to receive suitable input signals (e.g., address, control and timing signals) and to generate appropriate internal signals with respect to memory operations. Row decoder (XDEC) circuitry 705 may comprise one or more portions of inactive XDEC circuitry, e.g., XDEC 704A and 704B, an active XDEC row 706, and a reference XDEC 708. A memory array 711 may include a reference row 710 with one or more reference cells, non-switching array portions 713A and 713B, and a selected row of memory cells, i.e., active row 712. Serving the I/O and column MUX functionality, a plurality of generalized I/O blocks, I/O-0 714-0 to I/O-(N−1) 714-(N−1) as well as a reference I/O block 716 may be provided for the memory instance 700.

As alluded to previously, the leaf cells of the memory instance 700 may be grouped in accordance with the functional blocks thereof. That is, all leaf cells corresponding to active memory array may be treated as a single group. Likewise, the leaf cells of inactive XDEC, center, I/O may be treated in groups such that capacitance estimates of a single cell in a particular group may be extrapolated to the entire group.

Figure 8:
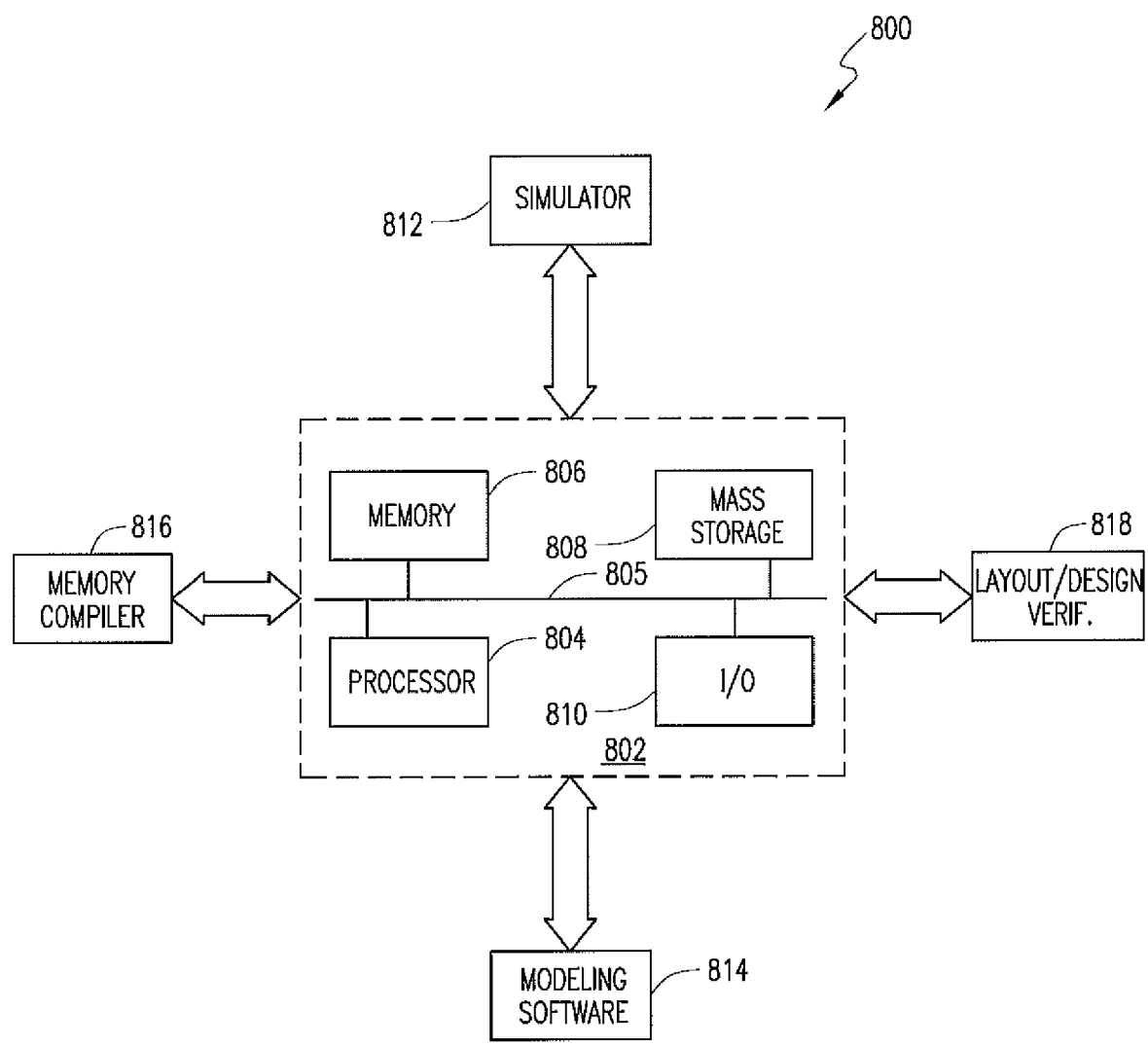
FIG. 8 illustrates a computer system operable to implement the method of approximating intrinsic capacitance in accordance with an embodiment of the present disclosure.

FIG. 8 illustrates a computer system 800 operable to implement the method of approximating intrinsic capacitance in accordance with an embodiment of the present disclosure. A suitable hardware platform 802 includes one or more processors 804, one or more memory blocks 806, one or more mass storage units 808 and one or more I/0 blocks 810, all interconnected together via a bus system 805. A simulator 812 is operable to perform device and circuit simulations using applicable software, e.g., SPICE, with respect to a particular IC block being characterized. Also included are a memory compiler 816 for compiling memory instances of variable topologies/configurations as well as a layout/design verification module 818. Modeling software 814 is preferably operable to effectuate one or more of the embodiments set forth above with respect to approximating the total intrinsic capacitance and its components with respect to the IC block. Also, if an internal decoupling capacitor is provided with respect to the IC block, the modeling software 814, which may be provided as a computer program product or a computer-readable medium executable on the hardware platform 802, is operable to account for such capacitance in estimating the total intrinsic capacitance of the IC block.

It is believed that the operation and construction of the present disclosure will be apparent from the foregoing Detailed Description. While some aspects of the method and circuitry shown and described may have been characterized as being preferred, it should be readily understood that various changes and modifications could be made therein without departing from the scope of the present disclosure as set forth in the following claims.

What is claimed is:

1. A computer implemented method of approximating intrinsic capacitance of an integrated circuit (IC) block, comprising:
   dividing said IC block into a plurality of leaf cells that are categorized into groups;
   estimating an N-well capacitance associated with said IC block to obtain an N-well capacitance estimate;
   estimating a metal grid capacitance associated with said IC block to obtain a metal grid capacitance estimate;
   estimating a non-switching circuitry capacitance associated with said IC block to obtain a non-switching circuitry capacitance estimate; and
   estimating a total intrinsic capacitance associated with said IC block based on said estimates of N-well capacitance, metal grid capacitance and non-switching circuitry capacitance, wherein at least one of said estimates is obtained by estimating on a leaf cell basis and extrapolating to an entire group to obtain a respective group estimate, then aggregating said group estimates.

2. The method of approximating intrinsic capacitance as set forth in claim 1, further comprising:
   calculating, for each group, a leaf cell's N-well capacitance and extrapolating it with respect to the entire group; and
   obtaining said N-well capacitance estimate for said IC block by aggregating each group's N-well capacitance.

3. The method of approximating intrinsic capacitance as set forth in claim 2, further comprising ensuring that overlapping dimensions of at least two adjacent leaf cells are not counted multiple times in said extrapolating step.

4. The method of approximating intrinsic capacitance as set forth in claim 3, wherein said ensuring is effectuated by designating a particular leaf cell such that it does not share an N-well boundary with another leaf cell.

5. The method of approximating intrinsic capacitance as set forth in claim 1, wherein said metal grid capacitance estimate is obtained by measuring metal capacitance associated with active leaf cells of said IC block during at least one of a read operation and a write operation.

6. The method of approximating intrinsic capacitance as set forth in claim 1, further comprising:
 initializing a leaf cell's inputs and latches;
 decrementing a voltage applied to said leaf cell by a predetermined amount in a predetermined time interval;
 measuring a change in electric charge applied to said IC block; and
 obtaining said non-switching circuitry capacitance estimate based on said change in electric charge and aggregating it over said IC block.

7. The method of approximating intrinsic capacitance as set forth in claim 6, further comprising subtracting a leakage component in obtaining said non-switching circuitry capacitance estimate.

8. The method of approximating intrinsic capacitance as set forth in claim 1, further comprising:
 determining if an internal decoupling capacitor is associated with said IC block;
 if so, estimating a capacitance value with respect to said internal decoupling capacitor; and
 accounting for said capacitance value in estimating said total intrinsic capacitance associated with said IC block.

9. A computer-implemented system for approximating intrinsic capacitance of an integrated circuit (IC) block, comprising:
 means for dividing said IC block into a plurality of leaf cells that are categorized into groups;
 means for estimating an N-well capacitance associated with said IC block to obtain an N-well capacitance estimate;
 means for estimating a metal grid capacitance associated with said IC block to obtain a metal grid capacitance estimate;
 means for estimating a non-switching circuitry capacitance associated with said IC block to obtain a non-switching circuitry capacitance estimate; and
 means for estimating a total intrinsic capacitance associated with said IC block based on said estimates of N-well capacitance, metal grid capacitance and non-switching circuitry capacitance, wherein at least one of said estimates is obtained by estimating on a leaf cell basis and extrapolating to an entire group to obtain a respective group estimate, then aggregating said group estimates.

10. The computer-implemented system for approximating intrinsic capacitance as set forth in claim 9, further comprising:
 means for calculating, for each group, a leaf cell's N-well capacitance and for extrapolating it with respect to the entire group; and
 means for obtaining said N-well capacitance estimate for said IC block by aggregating each group's N-well capacitance.

11. The computer-implemented system for approximating intrinsic capacitance as set forth in claim 10, further comprising means for ensuring that overlapping dimensions of at least two adjacent leaf cells are not counted multiple times in said extrapolating step.

12. The computer-implemented system for approximating intrinsic capacitance as set forth in claim 11, wherein said ensuring is effectuated by designating a particular leaf cell such that it does not share an N-well boundary with another leaf cell.

13. The computer-implemented system for approximating intrinsic capacitance as set forth in claim 9, further comprising:
 means for initializing a leaf cell's inputs and latches;
 means for measuring a change in electric charge applied to said leaf cell in a predetermined time interval; and
 means for obtaining said non-switching circuitry capacitance estimate based on said change in electric charge and aggregating it over said IC block.

14. The computer-implemented system for approximating intrinsic capacitance as set forth in claim 9, further comprising means for estimating a capacitance value with respect to an internal decoupling capacitor associated with said IC block such that said capacitance value is accounted for in estimating said total intrinsic capacitance associated with said IC block.

15. The computer-implemented system for approximating intrinsic capacitance as set forth in claim 9, wherein said metal grid capacitance estimate is obtained by measuring metal capacitance associated with active leaf cells of said IC block during at least one of a read operation and a write operation.

16. A computer-readable medium having instructions for approximating intrinsic capacitance of an integrated circuit (IC) block, comprising:
 a code portion for dividing said IC block into a plurality of leaf cells that are categorized into groups;
 a code portion for estimating an N-well capacitance associated with said IC block to obtain an N-well capacitance estimate;
 a code portion for estimating a metal grid capacitance associated with said IC block to obtain a metal grid capacitance estimate;
 a code portion for estimating a non-switching circuitry capacitance associated with said IC block to obtain a non-switching circuitry capacitance estimate; and
 a code portion for estimating a total intrinsic capacitance associated with said IC block based on said estimates of N-well capacitance, metal grid capacitance and non-switching circuitry capacitance, wherein at least one of said estimates is obtained by estimating on a leaf cell basis and extrapolating to an entire group to obtain a respective group estimate, then aggregating said group estimates.

17. The computer-readable medium as set forth in claim 16, further comprising:
 a code portion for calculating, for each group, a leaf cell's N-well capacitance and for extrapolating it with respect to the entire group; and
 a code portion for obtaining said N-well capacitance estimate for said IC block by aggregating each group's N-well capacitance.

18. The computer-readable medium as set forth in claim 17, further comprising a code portion for ensuring that overlapping dimensions of at least two adjacent leaf cells are not counted multiple times in said extrapolating step.

19. The computer-readable medium as set forth in claim 18, wherein said ensuring is effectuated by designating a particular leaf cell such that it does not share an N-well boundary with another leaf cell.

20. The computer-readable medium as set forth in claim 16, further comprising:
- a code portion for initializing a leaf cell's inputs and latches;
- a code portion for decrementing a voltage applied to said leaf cell by a predetermined amount in a predetermined time interval;
- a code portion for measuring a change in electric charge applied to said leaf cell; and
- a code portion for obtaining said non-switching circuitry capacitance estimate based on said change in electric charge and aggregating it over said IC block.

21. The computer-readable medium as set forth in claim 16, further comprising a code portion for estimating a capacitance value with respect to an internal decoupling capacitor associated with said IC block such that said capacitance value is accounted for in estimating said total intrinsic capacitance associated with said IC block.

22. The computer-readable medium as set forth in claim 16, wherein said metal grid capacitance estimate is obtained by measuring metal capacitance associated with active leaf cells of said IC block during at least one of a read operation and a write operation.

* * * * *

UNITED STATES PATENT AND TRADEMARK OFFICE
CERTIFICATE OF CORRECTION

PATENT NO. : 7,549,136 B2
APPLICATION NO. : 11/614133
DATED : June 16, 2009
INVENTOR(S) : Vipin Kumar Tiwari It is certified that error appears in the above-identified patent and that said Letters Patent is hereby corrected as shown below:

Title Page, Abstract, line 3
(57), "compliable" should read -- compilable --.

Signed and Sealed this

Twenty-fifth Day of August, 2009

David J. Kappos
*Director of the United States Patent and Trademark Office*